United States Patent [19]
Ikeda et al.

[11] Patent Number: 5,898,248
[45] Date of Patent: Apr. 27, 1999

[54] SMALL MOTOR HOLDING DEVICE IN INDIVIDUAL CALLING RECEIVER

[75] Inventors: Kazuhiro Ikeda; Shuuichi Sugawara, both of Miyagi; Kenichi Nishikawa, Kanagawa, all of Japan

[73] Assignee: Matsushita Electric Industrial Co., Ltd., Osaka, Japan

[21] Appl. No.: 08/935,236

[22] Filed: Sep. 22, 1997

[30] Foreign Application Priority Data

Sep. 25, 1996 [JP] Japan ................................. 8-253421

[51] Int. Cl.⁶ ................................................ H02K 5/00
[52] U.S. Cl. ................................................ 310/91; 310/81
[58] Field of Search ........................... 310/51, 81, 91;
361/760, 761, 807, 809, 814, 825; 74/87;
248/609, 615, 632, 633, 634, 635, 677,
686, 687, 688

[56] References Cited

U.S. PATENT DOCUMENTS 5,657,205  8/1997  Tamaru et al. ................... 310/81 X
5,673,157  9/1997  Ycas et al. ....................... 360/97.01
5,786,647  7/1998  Vollmer et al. ....................... 310/89

*Primary Examiner*—Nestor Ramirez
*Assistant Examiner*—Judson H. Jones
*Attorney, Agent, or Firm*—Pearne, Gordon, McCoy & Granger LLP

[57] ABSTRACT

A small motor holding device in an individual Stalling receiver is designed, in which, even when the casing is shocked, the small motor is scarcely shocked, and vibration informing of the reception of a calling signal is transmitted positively to the casing, and which can be assembled with high work efficiency. A small motor is held in a motor holder of elastic material. The motor holder is coupled to a printed circuit board with the engaging section of the motor holder engaged with the engaging/receiving section of the printed circuit board. The motor holder is detachably press-fitted in a holding frame which is fixedly formed on the inner surface of a casing.

12 Claims, 3 Drawing Sheets

SMALL MOTOR HOLDING DEVICE IN INDIVIDUAL CALLING RECEIVER

BACKGROUND OF THE INVENTION

This invention relates to a small motor holding device in an individual calling receiver.

When an individual calling receiver receives a calling signal, it produces a sound to inform the bearer of the reception of the calling signal. However, the production of the sound may bother people around the receiver. In order to overcome this difficulty, an individual calling receiver has been proposed which produces vibration instead of sound. The receiver which produces vibration is designed as follows: An eccentric weight is mounted on the rotary shaft of a small motor. That is, upon reception of a calling signal, the small motor is turned to vibrate. The vibration is transmitted to the casing to inform the bearer of the reception of the calling signal.

Heretofore, in an individual calling receiver of this type, a small motor is inserted into a holder of elastic material such as rubber, and the holder is set on a printed circuit board, and is fixedly held with the inner surfaces of the upper and lower casings, or a small motor is directly mounted on a printed circuit board to vibrate the casing through the printed circuit board.

However, the individual calling receiver in which the small motor is directly mounted on the printed circuit board suffers from the following difficulties: For instance when it is dropped; that is, the casing holding the printed circuit board is shocked, the motor body is liable to be shocked. Hence, the motor is liable to be deteriorated in performance, so that the vibration is unstable.

In the individual calling receiver in which the small motor is inserted into the holder of rubber, and the holder is set on the printed circuit board, and is fixedly held with the inner surfaces of the upper and lower casings, the small motor is held by the upper and lower surfaces only. Hence, it is rather difficult to transmit the vibration positively to the casing. If it is tried to insert the motor into the casing together with the printed circuit board, since the rubber holder is held unstable, the assembling work of the receiver is low in efficiency.

SUMMARY OF THE INVENTION

Accordingly, an object of the invention is to eliminate the above-described difficulties accompanying a conventional individual calling receiver. More specifically, an object of the invention is to provide a small motor holding device in an individual calling receiver in which, even when the casing is shocked, the small motor is scarcely shocked, and vibration informing of the reception of a calling signal is transmitted positively to the casing, and which can be assembled with high work efficiency.

The foregoing object of the invention has been achieved by the provision of a small motor holding device which, according to the invention, comprises:

a motor holder of elastic material which holds a small motor;

a printed circuit board which is coupled to the motor holder with an engaging section of the motor holder engaged with an engaging/receiving section; and a holding frame fixedly formed on the inner surface of the casing, the motor holder being detachably press-fitted in the holding frame.

In the small motor holding device, the small motor is held in the motor holder of elastic material, and therefore the small motor is protected from being externally shocked. The motor holder holding the small motor is press-fitted in the holding frame which is fixedly formed on the inner surface of the casing, so that the vibration of the motor is positively directly transmitted to the casing. In addition, the motor holder, which is engaged with the engaging section through the engaging/receiving section, is stably engaged with the printed circuit board.

Furthermore, in the small motor holding device, a second printed circuit board is provided which is pushed against the surface of the motor holder which is opposite to the surface on the holding frame press-fit side thereof, so that the motor holder can be press-fitted in the holding frame through the second printed circuit board. Hence, the small motor holding device of the invention can be assembled with high work efficiency.

DETAILED DESCRIPTION OF THE PREFERRED EMBODIMENT

One preferred embodiment of the invention will be described with reference to the accompanying drawings in detail.

Figure 1A:
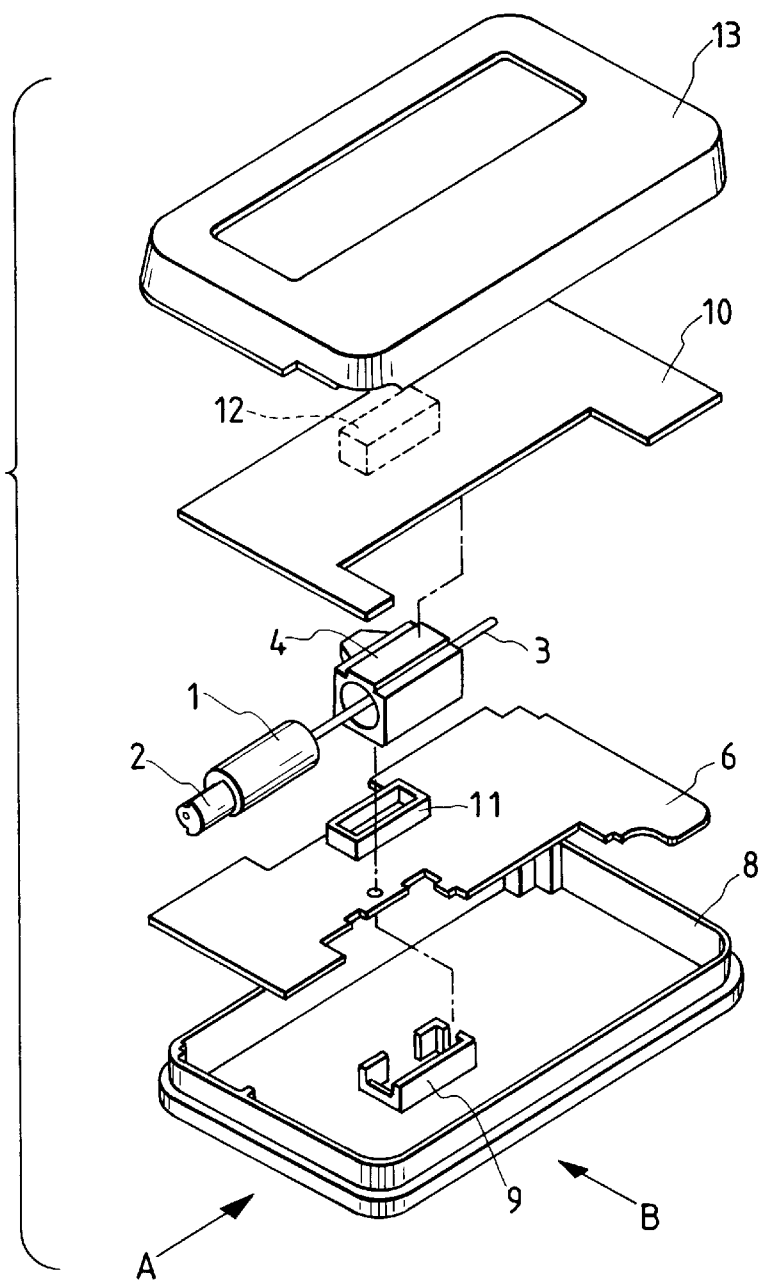
FIGS. 1(*a*) and 1(*b*) are exploded perspective views showing a small motor holding device, which constitutes an embodiment of the invention.
Figure 1B:
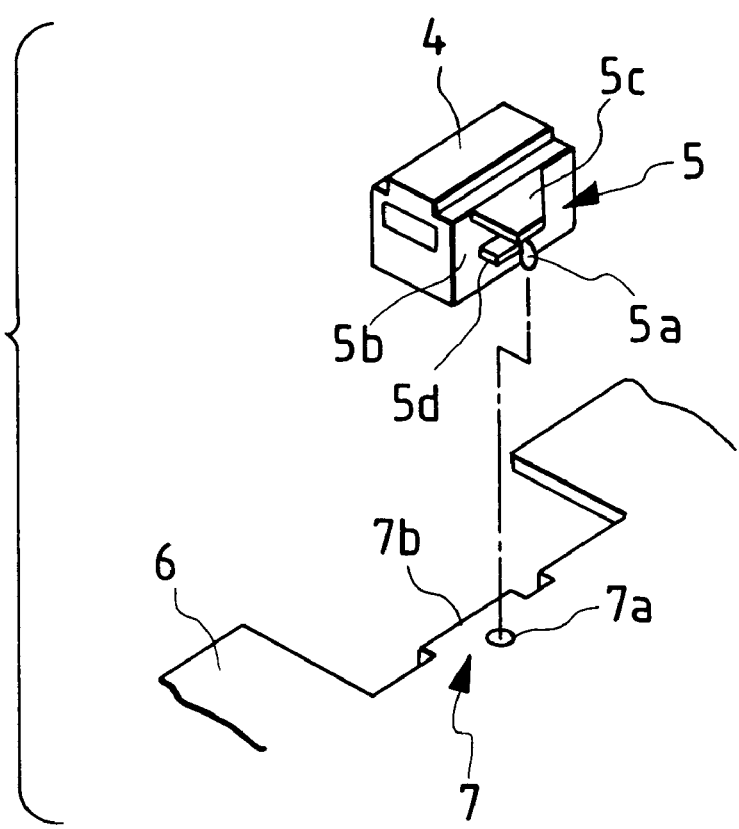

FIGS. 1(*a*) through 3 show the arrangement of a small motor holding device, the embodiment of the invention.

In FIGS. 1(*a*) through 3, reference numeral 1 designates a small motor; 2, an eccentric weight mounted on the rotary shaft of the small motor 1; 3, a lead wire; and 4, a motor holder which is made of an elastic material and has a hole into which the small motor 1 is inserted. As shown in FIG. 1(*b*), the motor holder has an engaging section 5. Reference numeral 6 designates a printed circuit board having an engaging/receiving section 7 with which the engaging section 5 of the motor holder is engaged. In the engaging section 5, a protrusion 5*a* is extended from the end of a prolongation 5*c* which is extended from the side surface of the motor holder 4. The protrusion 5*a* is inserted into an engaging hole 7*a* formed in the engaging/receiving section 7 of the printed circuit board 6, while the edge portion 7*b* of the engaging/receiving section 7 is abutted against a motor holder side surface 5*b* between two prolongations 5*c* and 5*d* of the engaging section 5, so that the motor holder 4 is stably mounted on the printed circuit board 6 (see FIG. 2).

Figure 2:
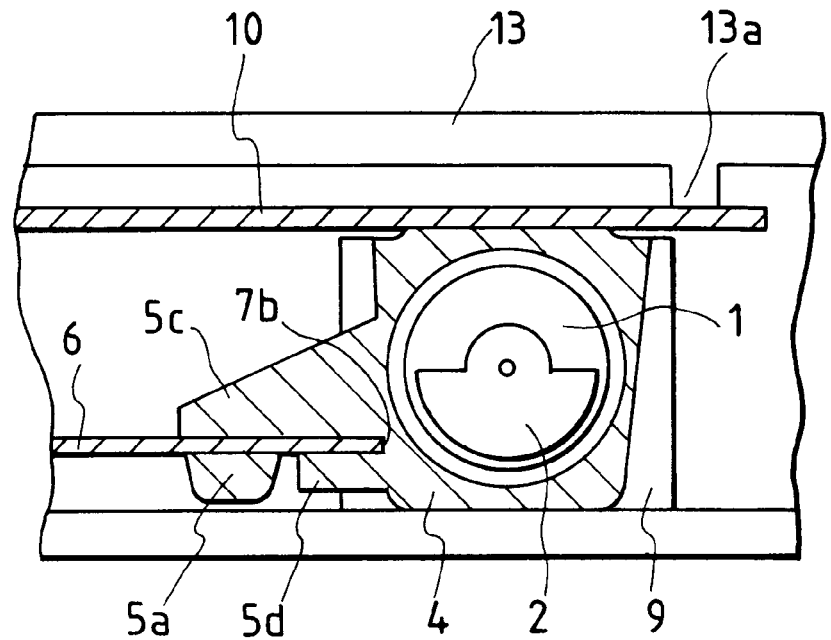
FIG. 2 is a sectional view of a motor section as viewed in the direction of the arrow A in FIG. 1.
Figure 3:
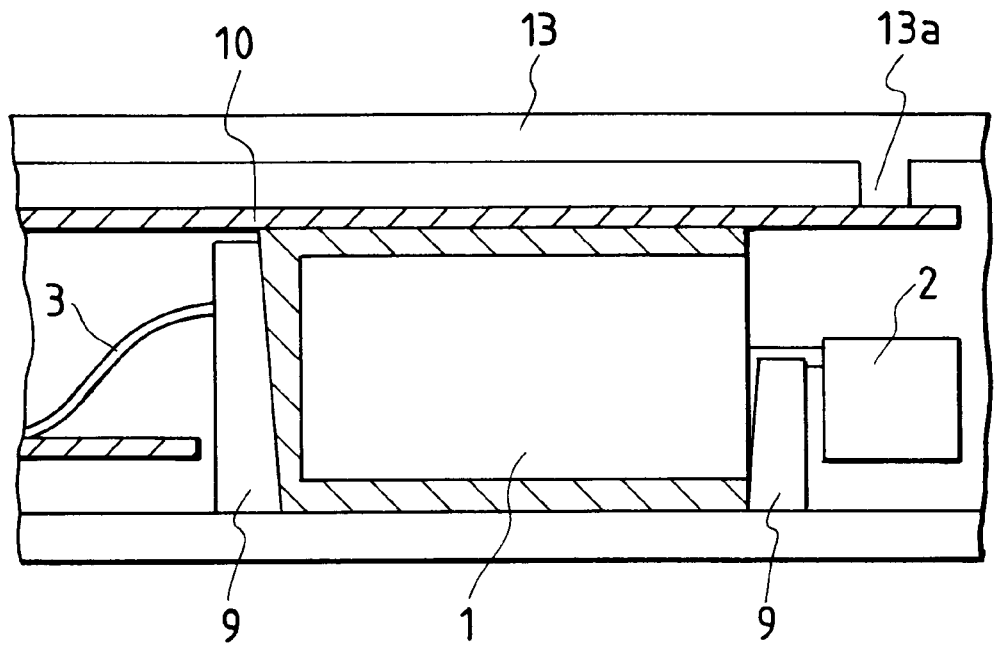
FIG. 3 is a sectional view of the motor section as viewed in the direction of the arrow B in FIG. 1.

Reference numeral 8 denotes a lower casing, on the inner surface of which a holding frame 9 is fixedly provided. The motor holder 4 is detachably press-fitted in the holding frame 9. The holding frame 9 is made up of four surrounding walls whose inner surfaces are tapered as shown in FIGS. 2 and 3 so that the motor holder 4 can be press-fitted in the holding frame with ease. The reference numeral 10 designates a (second) printed circuit board which is in contact with the surface of the motor holder 4 which is on the side opposite to the holding-frame press-fit side. The printed circuit board 10 has a connector 12, which is engaged with a connector 11 formed on the (first) printed circuit board 6. Reference numeral 13 designates an upper casing.

The embodiment is assembled as follows: First, the small motor 1 is inserted into the hole of the motor holder 4, and then the engaging section 5 of the motor holder 4 is engaged with the engaging/receiving section 7 of the printed circuit board 6. The protrusion 5a of the engaging section 5 is slightly larger than the engaging hole 7a of the engaging/receiving section 7. Hence, after the protrusion 5a has been engaged with the engaging/receiving section 7, the former is scarcely disengaged from the latter. In addition, the edge portion 7b of the printed circuit board 6 is inserted between the two prolongations 5c and 5d of the engaging section 5, so that the motor holder 4 is stably coupled to the printed circuit board. The prolongations 5c and 5d and the protrusion 5a are made of elastic material, and, when necessary, the motor holder can be disengaged from the printed circuit board.

Next, the connector 11 is engaged with the connector 12, so that the printed circuit board 6 is coupled to the printed circuit board 13. In this case, the surface of the motor holder which is opposite to the surface on the holding frame press-fit side, is brought into close contact with the printed circuit board 13. A unit comprising the motor holder 4 (adapted to hold the small motor 1) and two printed circuit boards 6 and 10, is inserted into the lower casing 8. More specifically, the unit is inserted into the lower casing 8 with the outer edges of the printed circuit boards 6 and 10 slid along the inner surface of the walls of the lower casing 8. In this operation, the motor holder 4 just meets the holding frame 9. Hence, when the motor holder 4 is pushed through the printed circuit board 10, the motor holder is readily press-fitted in the holding frame 9 having the tapered inner surfaces.

Thereafter, the upper casing 13 is engaged with the lower casing 8. In this operation, a casing rib 13a formed on the inner surface of the upper casing 13 is pushed on the upper surface of the printed circuit board 10. Hence, the upper surface of the motor holder 4 holding the small motor 1, is pushed against the printed circuit board 10, and the lower surface and the four side surfaces are pushed against the holding frame 9, so that the motor holder is fixedly held by the upper and lower casings 8 and 13.

As was described above, in the embodiment, the motor holder 4 holding the small motor 1 is fixed by the casings 8 and 13 in six different directions, so that the vibration of the motor is positively transmitted to the casings 8 and 13. The small motor 1 is held by the motor holder of elastic material, and therefore it is sufficiently protected from being shocked for instance when dropped. The printed circuit board 6 is coupled to the motor holder with high mechanical strength. Hence, the small motor holding device of the invention can be assembled with high efficiency. Furthermore, when the motor holder 4 is press-fitted in the holding frame 9, the former 4 can be readily press-fitted in the latter 9 through the printed circuit board 10. Hence, the small motor holding device of the invention can be more readily assembled. In addition, when it is required to remove the printed circuit boards from the casings, they can be removed, as one unit, therefrom.

As was described above, in the small motor holding device according to the invention, the small motor is held in the motor holder of elastic material, and the motor holder is positively coupled to the printed circuit board with the engaging section of the motor holder engaged with the engaging/receiving section of the printed circuit board, and the motor holder is detachably press-fitted in the holding frame which is fixedly formed on the inner surface of the casing. Hence, the vibration of the motor is positively transmitted to the casing, and furthermore the small motor is protected from being shocked for instance when the device is dropped, and the device can be assembled with high work efficiency.

What is claimed is:

1. In an individual calling receiver in which a small motor whose rotary shaft has an eccentric weight is provided, and upon reception of a calling signal, said small motor is turned to produce vibration which is transmitted to a casing to inform a bearer of the reception of said calling signal, a small motor holding device comprising:

a motor holder of elastic material, said motor holder holding said small motor; and a holding frame fixedly provided on an inner surface of said casing, wherein said motor holder is detachably press-fitted in said holding frame.

2. In an individual calling receiver in which a small motor whose rotary shaft has an eccentric weight is provided, and upon reception of a calling signal, said small motor is turned to produce vibration which is transmitted to a casing to inform a bearer of the reception of said calling signal, a small motor holding device comprising:

a motor holder of elastic material, said motor holder holding said small motor;

a holding frame fixedly provided on an inner surface of said casing, said motor holder being detachably press-fitted in said holding frame; and, a first printed circuit board coupled to said motor holder such that an engaging/receiving section of said first printed circuit board is engaged with an engaging section of said motor holder, wherein said motor holder is detachably press-fitted in said holding frame under a condition that said first printed circuit board has been coupled to said motor.

3. A small motor holding device as claimed in claim 2, further comprising:

a second printed circuit board pushed against a surface of said motor holder which is opposite to a surface on the holding frame press-fit side thereof, so that said motor holder is press-fitted in said holding frame through said second printed circuit board.

4. A small motor holding device as claimed in claim 2, wherein said engaging/receiving section of said first printed circuit board has an edge portion, said engaging section of said motor holder has a pair of prolongations, and wherein said edge portion is held between said pair of prolongations when said first printed circuit board has been coupled to said motor holder.

5. A small motor holding device as claimed in claim 2, wherein said engaging/receiving section of said first printed circuit board has an edge portion, and wherein said edge portion is in surface-contact with a side surface of said motor holder when said first printed circuit board has been coupled to said motor holder.

6. A small motor holding device as claimed in claim 1, wherein said holding frame has a tapered recessed portion receiving said motor holder therein.

7. In an individual calling receiver in which a small motor whose rotary shaft has an eccentric weight is provided, and upon reception of a calling signal, said small motor is turned to produce vibration which is transmitted to a casing to inform a bearer of the reception of said calling signal, a small motor holding device comprising:

a motor holder of elastic material, said motor holder holding said small motor; and a first printed circuit board coupled to said motor holder such that an engaging/receiving section of said first printed circuit board is engaged with an engaging section of said motor holder, wherein said motor holder is installed in place to contact with an inner surface of said casing under a condition that said first printed circuit board has been coupled to said motor.

8. A small motor holding device as claimed in claim 7, further comprising:

a holding frame fixedly provided on an inner surface of said casing, wherein said motor holder being detachably press-fitted in said holding frame when said motor has been installed in place.

9. A small motor holding device as claimed in claim 7, further comprising:

a second printed circuit board pushed against a surface of said motor holder so that said motor holder is held between said inner surface of said casing and said second printed circuit board.

10. A small motor holding device as claimed in claim 7, wherein said engaging/receiving section of said first printed circuit board has an edge portion, said engaging section of said motor holder has a pair of prolongations, and wherein said edge portion is held between said pair of prolongations when said first printed circuit board has been coupled to said motor holder.

11. A small motor holding device as claimed in claim 7, wherein said engaging/receiving section of said first printed circuit board has an edge portion, and wherein said edge portion is in surface-contact with a side surface of said motor holder when said first printed circuit board has been coupled to said motor holder.

12. A small motor holding device as claimed in claim 8, wherein said holding frame has a tapered recessed portion receiving said motor holder therein.

* * * * *